(12) United States Patent
Marvin et al.

(10) Patent No.: US 8,710,847 B2
(45) Date of Patent: Apr. 29, 2014

(54) SELF-CORRECTING AMPLIFIER SYSTEM

(76) Inventors: Donald Marvin, San Jose, CA (US);
John McHardy, Oxnard, CA (US);
Kurt Salloux, Woodside, CA (US)

(*) Notice: Subject to any disclaimer, the term of this patent is extended or adjusted under 35 U.S.C. 154(b) by 346 days.

(21) Appl. No.: 13/284,788

(22) Filed: Oct. 28, 2011

(65) Prior Publication Data

US 2012/0105066 A1   May 3, 2012

Related U.S. Application Data

(60) Provisional application No. 61/407,443, filed on Oct. 28, 2010.

(51) Int. Cl.
*G01N 27/416*   (2006.01)
*H02J 7/00*   (2006.01)

(52) U.S. Cl.
USPC ............................ 324/426; 320/132; 320/152

(58) Field of Classification Search
CPC .................................................. G01R 31/3648
USPC .......................................................... 324/426
See application file for complete search history.

(56) References Cited

U.S. PATENT DOCUMENTS

| | | |
|---|---|---|
| 5,140,269 A | 8/1992 | Champlin |
| 5,574,355 A | 11/1996 | McShane et al. |
| 5,757,192 A | 5/1998 | McShane et al. |
| 6,023,150 A | 2/2000 | Patino et al. |
| 6,051,976 A | 4/2000 | Bertness |
| 6,081,098 A | 6/2000 | Bertness et al. |
| 6,091,245 A | 7/2000 | Bertness |
| 6,104,167 A | 8/2000 | Bertness et al. |
| 6,172,505 B1 | 1/2001 | Bertness |
| 6,313,608 B1 | 11/2001 | Varghese et al. |
| 6,323,650 B1 | 11/2001 | Bertness et al. |
| 6,329,793 B1 | 12/2001 | Bertness et al. |
| 6,411,098 B1 | 6/2002 | Laletin |
| 6,466,026 B1 | 10/2002 | Champlin |
| 6,566,883 B1 | 5/2003 | Vonderhaar et al. |
| 6,633,165 B2 | 10/2003 | Bertness |
| 6,707,303 B2 | 3/2004 | Bertness et al. |
| 6,805,090 B2 | 10/2004 | Bertness et al. |
| 6,806,716 B2 | 10/2004 | Bertness et al. |
| 6,832,171 B2 | 12/2004 | Barsoukov et al. |
| 6,871,151 B2 | 3/2005 | Bertness |

(Continued)

FOREIGN PATENT DOCUMENTS

EP   1206826 B1   2/2009

OTHER PUBLICATIONS

U.S. Appl. No. 12/963,500 Non-Final Office Action issued Feb. 5, 2013 (29 pages).

(Continued)

*Primary Examiner* — Edward Tso
*Assistant Examiner* — Ahmed Omar
(74) *Attorney, Agent, or Firm* — Peters Verny LLP

(57) ABSTRACT

DC offsets introduced in battery testing equipment are automatically compensated for using complementary current-mode servo feedback. An op amp receives and amplifies a response signal, while also introducing internal errors manifested in the amplified response signal. A correction circuitry coupled to receive the amplified response signal and comprising a balanced circuit with a positive input correction device and a negative input correction device to remove the DC bias. The correction circuitry further comprises an error sensing device to correct for the internal errors introduced by the op amp.

14 Claims, 5 Drawing Sheets

(56) References Cited

U.S. PATENT DOCUMENTS

| | | |
|---|---|---|
| 6,885,195 B2 | 4/2005 | Bertness |
| 6,906,523 B2 | 6/2005 | Bertness et al. |
| 6,930,485 B2 | 8/2005 | Bertness et al. |
| 6,990,422 B2 | 1/2006 | Laletin et al. |
| 7,003,411 B2 | 2/2006 | Bertness |
| 7,081,755 B2 | 7/2006 | Klang et al. |
| 7,126,341 B2 * | 10/2006 | Bertness et al. ............... 324/426 |
| 7,253,680 B2 | 8/2007 | Laletin |
| 7,398,176 B2 | 7/2008 | Bertness |
| 7,446,536 B2 | 11/2008 | Bertness |
| 7,479,763 B2 | 1/2009 | Bertness |
| 7,557,586 B1 | 7/2009 | Vonderhaar et al. |
| 7,595,611 B2 | 9/2009 | Reynier et al. |
| 7,595,643 B2 | 9/2009 | Klang |
| 7,598,699 B2 | 10/2009 | Restaino et al. |
| 7,598,743 B2 | 10/2009 | Bertness |
| 7,598,744 B2 | 10/2009 | Bertness et al. |
| 7,656,162 B2 | 2/2010 | Vonderhaar et al. |
| 7,688,074 B2 | 3/2010 | Cox et al. |
| 7,705,602 B2 | 4/2010 | Bertness |
| 7,706,991 B2 | 4/2010 | Bertness et al. |
| 7,710,119 B2 | 5/2010 | Bertness |
| 7,723,993 B2 | 5/2010 | Klang |
| 7,728,597 B2 | 6/2010 | Bertness |
| 7,772,850 B2 | 8/2010 | Bertness |
| 7,777,612 B2 | 8/2010 | Sampson et al. |
| 7,786,702 B1 | 8/2010 | Chait et al. |
| 7,786,734 B2 | 8/2010 | Andersson |
| 7,791,348 B2 | 9/2010 | Brown et al. |
| 7,808,131 B2 | 10/2010 | Hurst et al. |
| 7,808,375 B2 | 10/2010 | Bertness et al. |
| 7,924,015 B2 | 4/2011 | Bertness |
| 7,940,052 B2 | 5/2011 | Vonderhaar et al. |
| 7,940,053 B2 | 5/2011 | Brown et al. |
| 7,959,476 B2 | 6/2011 | Smith et al. |
| 7,977,914 B2 | 7/2011 | Bertness |
| 7,999,505 B2 | 8/2011 | Bertness |
| 8,164,343 B2 | 4/2012 | Bertness |
| 8,190,383 B2 | 5/2012 | Chen et al. |
| 8,190,384 B2 | 5/2012 | Zhang et al. |
| 8,192,789 B2 | 6/2012 | Albano et al. |
| 8,198,759 B2 | 6/2012 | Hurst et al. |
| 8,198,900 B2 | 6/2012 | Bertness et al. |
| 8,203,345 B2 | 6/2012 | Bertness |
| 8,237,407 B2 | 8/2012 | Hurst et al. |
| 8,237,448 B2 | 8/2012 | Bertness |
| 8,306,690 B2 | 11/2012 | Bertness et al. |
| 8,344,685 B2 | 1/2013 | Bertness et al. |
| 8,357,464 B2 | 1/2013 | Sastry et al. |
| 8,436,619 B2 | 5/2013 | Bertness et al. |
| 8,442,877 B2 | 5/2013 | Bertness et al. |
| 8,471,520 B2 | 6/2013 | Coe et al. |
| 8,493,022 B2 | 7/2013 | Bertness |
| D687,727 S | 8/2013 | Kehoe et al. |
| 8,513,949 B2 | 8/2013 | Bertness |
| 8,516,429 B2 | 8/2013 | Wu et al. |
| 2003/0088375 A1 | 5/2003 | Beretness et al. |
| 2004/0145352 A1 | 7/2004 | Harrison |
| 2006/0006876 A1 * | 1/2006 | Bertness ..................... 324/426 |
| 2007/0252435 A1 | 11/2007 | Coe et al. |
| 2010/0201320 A1 | 8/2010 | Coe et al. |
| 2011/0218747 A1 | 9/2011 | Bertness |
| 2011/0300416 A1 | 12/2011 | Bertness |
| 2011/0309800 A1 | 12/2011 | Bertness |
| 2012/0041697 A1 | 2/2012 | Stukenberg |
| 2012/0041698 A1 | 2/2012 | Zhang et al. |
| 2012/0079710 A1 | 4/2012 | Bertness |
| 2012/0105066 A1 | 5/2012 | Marvin et al. |
| 2013/0087624 A1 | 4/2013 | Bertness et al. |
| 2013/0158782 A1 | 6/2013 | Bertness et al. |

OTHER PUBLICATIONS

Christen, Thomas, et al., Energy-power relations of supercaps from impedance spectroscopy data, Dec. 1999, 5 pages.

Christen, Thomas, et al., Theory of Ragone plots, Journal of Power Sources 91 (2000), pp. 210-216.

Fasih, Ahmed, Modeling and Fault Diagnosis of Automotive Lead-Acid Batteries, Apr. 2, 2006, pp. 1-94.

Gieraci, James, et al., Using the Cell Broadband Engine to Compute an Electrochemical Battery Model, Massachusetts Institute of Technology, pp. 1-6.

Grube, Ryan J., Automotive Battery State-of-Health Monitoring Methods, Wright State University, 2008, pp. 1-116.

Hindin, Barry S., Silver Corrosion Rates Measured by Resistivity Techniques in Flowing Mixed Gas Environments, 2005 Tri-Service Corrosion Conference, pp. 1-11.

Huang, Rongwen, Estimation of State-of-Charge of Lead-Acid Batteries Using Electrochemistry Theorem, MSME International Journal, Series C, vol. 49, No. 1, 2006, pp. 265-271.

Invention Disclosure, Addendum to disclosure p. 88, Temperature monitoring, Aug. 29, 2007, 1 page.

Invention Disclosure, Europa Meeting, Aug. 13, 2007, pp. 1-5.

Invention Disclosure, Instrument for detection of positive grid and/or current collector bus bar corrosion, Sep. 15, 2007, pp. 1-3.

Kim, Ui Seong, et al., Modeling of the capacity loss of a 12 V automotive lead-acid battery due to ageing and comparison with measurement data, Journal of Power Sources 190 (2009) pp. 184-188.

Maia, G., et al., A modelling approach to the optimization of lead-acid battery electrodes, Journal of Applied Electrochemistry 23 (1993), pp. 1151-1161.

Marahleh, G., et al., Creep-Life Prediction of Service-Exposed Turbine Blades, Materials Science, vol. 42, No. 4, 2006, pp. 476-481.

Morimoto, Y., et al., Computer Simulation of the Discharge Reaction in Lead-Acid Batteries, I-BIEM, vol. 135, No. 2, J. Electrochem. Soc: Electrochemical Science and Technology, Feb. 1988, pp. 293-298.

Papazov, G., et al., Influence of the Lead Dioxide Active Mass on the Corrosion Rate of the Spines of Positive Lead-Acid Battery Plates, Journal of Power Sources, 6 (1981) pp. 15-24.

Robinson, R. S., System noise as a signal source for impedance measurements on batteries connected to operating equipment, Journal of Power Sources, 42 (1993), pp. 381-388.

Rogatchev, T., et al., The Effect of Current Denisty and Thickness of the Active Mass Upon the Corrosion Rate of the Spines of Lead-Acid Battery Plates, Journal of Power Sources, 10 (1983), pp. 291-303.

Ruetschi, Paul, Aging mechanisms and service life of lead-acid batteries, Journal of Power Sources 127 (2004) pp. 33-44.

Stigh, U., Continuum Damage Mechanics and the Life-Fraction Rule, ASME Journal of Applied Mechanics, Sep. 2005, pp. 1-10.

Stigh, U., Continuum Damage Mechanics and the Life-Fraction Rule, ASME, vol. 73, Jul. 2006, pp. 702-704.

Sunu, Won G., et al., Mathematical Model for Design of Battery Electrodes, J. Electrochem. Soc.: Electrochemical Science and Technology, Apr. 1982, pp. 688-695.

Tinnemeyer, Jorn, A., 31-4: Diamagnetic Measurements in Lead Acid Batteries to Estimate State of Charge, Journal of Power Sources04312010, 4 pages.

Vaaler, L. E., et al., Computerized design and evaluation of improved electrodes for lead-acid batteries, Journal of Applied Electrochemistry 12 (1982), pp. 721-734.

* cited by examiner

SELF-CORRECTING AMPLIFIER SYSTEM

CROSS-REFERENCE TO RELATED APPLICATIONS

This application claims the benefit of priority under 35U.S.C. 119(e) as to U.S. Application No. 61/407,443 filed Oct. 28, 2010, entitled SELF-CORRECTING AMPLIFIER SYSTEM, by Donald Marvin et al., the contents of which is hereby incorporated by reference in its entirety.

FIELD OF THE INVENTION

The present invention relates generally, to electronic amplifiers, and more specifically, to employing complementary current-mode servo feedback to null out a DC bias.

BACKGROUND

The term servo feedback implies the use of an active integrator within a negative feedback loop coupled from the output to the input of an amplifier system. In the most basic configuration, an integrator comprises a high-gain differential amplifier provided with capacitive feedback connected between its output and inverting input. The non-inverting input is coupled to a reference potential, while a sampling resistor connects between the main output node and the inverting input of the main differential amplifier, so that the integrator produces an output that represents the inverse of the time-integral of the difference between the main amplifier's output signal and the reference potential. The gain of such an integrator circuit will approach the open loop gain of the embedded differential amplifier for DC signals and will fall off at, for example, 6 dB per octave as the frequency increases.

The output signal from the integrator may be used directly as the negative servo feedback signal, or it may control means that provide the necessary feedback signal. Since the magnitude of the servo feedback falls off with increasing frequency, the effective closed loop gain of the amplifier system will increase with frequency until an asymptotic value is reached where the gain for AC signals will be equal to the nominal closed loop gain of the amplifier system, as determined in the normal fashion. It is therefore seen that the application of negative servo feedback around an amplifier system will impart a high-pass characteristic to its overall transfer function. In addition, since the servo loop operates to force the amplifier's output to maintain an average value of DC ground, the residual AC signal appearing at the amplifier's output will appear centered about the local common potential, thereby maximizing the useful dynamic range of the amplifier system.

Routine measurement of AC impedance is becoming an important part of testing protocols for electrochemical devices, especially in backup power systems where an unexpected component failure can have serious (sometimes fatal) consequences. In these applications, information derived from impedance trends is used to identify aging battery cells and schedule their replacement before failure occurs. However, obtaining reliable impedance data under field conditions, which usually involves man-portable, battery-powered test equipment, presents two unique challenges.

First, electrochemical cells possess a substantial DC bias that must be nulled out in order to allow efficient amplification of the AC response. Although the introduction of current mode servo feedback (e.g., U.S. Pat. No. 7,253,680) provided one approach to this problem, it failed to address the related problem of DC offsets arising from the test equipment itself.

Second, the total impedance of a battery cell can be extremely low—in some cases ≤0.1 mΩ. Hence, even an input signal of 2 amps AC (close to the upper limit available from portable equipment) may yield a response of 0.1 mV AC or less. In order to achieve adequate signal-to-noise ratios (a particular concern when measurements are made in the presence of RF interference), the response must be averaged over very many cycles and can require unreasonably long periods of time per measurement.

Therefore, what is needed is a method for testing battery networks that can be applied while the batteries are in operation, that takes into account both individual and overall battery health, and that can make adjustments for the needs of a particular application.

SUMMARY

A method, system and computer program product for automatically compensating DC offsets introduced in, for example, battery testing equipment. In one embodiment, the system comprises electronic circuitry. The DC offsets can be nullified by, for example, complementary current-mode servo feedback.

In one embodiment, an input terminal to receive an excitation response signal comprising a DC bias and an AC response. An op amp coupled to receive and to amplify the response signal, the op amp introducing internal errors manifested in the amplified response signal. A servo integrator is coupled to receive the amplified response signal and to determine the DC bias and a rate of change of the amplified response signal, and in response, produces a servo feedback signal to compensate for the DC bias. A correction circuitry is coupled to receive the servo feedback signal and to output a correction current to the op amp, and to produce the correction current in order to remove the DC bias. Another embodiment includes an optional trim device to provide a variable resistance to the servo feedback signal.

In another embodiment, an error sensing device is coupled to receive the correction current and to output a feedback control signal. The error sensing device adjusts for the internal errors introduced by the correction circuitry. An output terminal outputs a corrected AC signal.

Advantageously, amplification of the battery response can be more efficient. The resulting enhancement in signal-to-noise ratio allows the diagnosis of battery condition in less time and with greater precision.

BRIEF DESCRIPTION OF THE DRAWINGS

In the following drawings like reference numbers are used to refer to like elements. Although the following figures depict various examples of the invention, the invention is not limited to the examples depicted in the figures.

DETAILED DESCRIPTION

A method, system and computer program product for automatically compensating for DC offsets arising from battery testing equipment are disclosed.

While the invention is described in connection with amplification of AC signals from electrochemical batteries, it must be understood that the principles involved are equally applicable to any measuring system that is required to amplify small AC signals in the presence of varying DC offsets.

Figure 1:
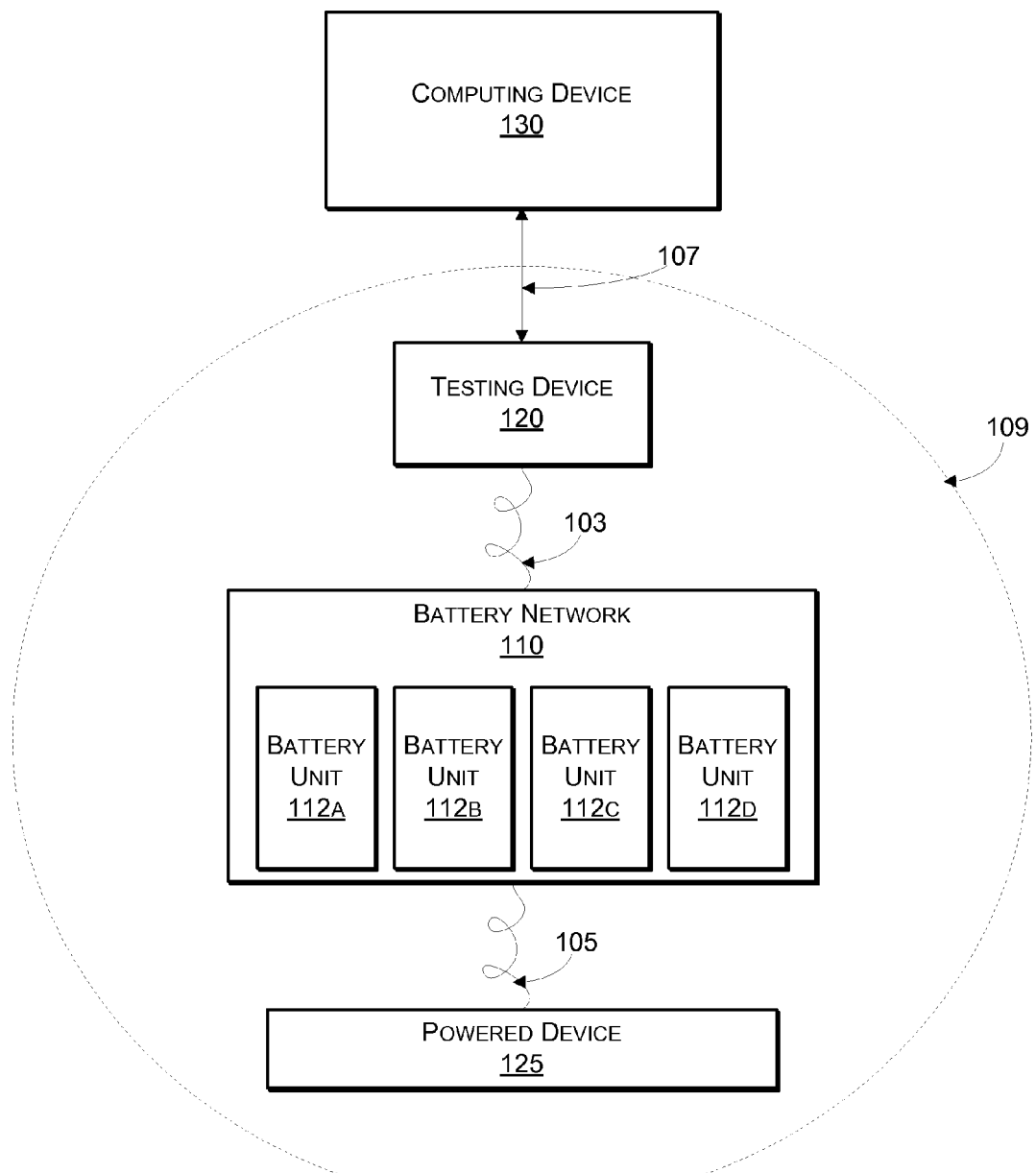
FIG. 1 is a block diagram illustrating a system for battery testing, according to one embodiment of the present invention.

FIG. 1 is a block diagram illustrating a system 100 to monitor battery conditions, according to one embodiment of the present invention. It will be understood that the embodiment of FIG. 1 is merely exemplary and can have alternative configurations with more or less components within the spirit of the present invention.

The system 100 generally comprises a battery network 110, a testing device 120, a computing device 130, and a powered device 125. The battery network 110 is wired to nodes of the testing device 120 during testing at a site 109 via line 103. Further, the testing device 120 is connected to the computing device 130 during data transfer via channel 107 (e.g., a serial or parallel data cord, wired or wireless Ethernet channel, USB cord, FireWire cord, or the like). Lastly, powered device 125 is connected to the battery network 110 to receive AC or DC power via electrical cable 105.

The battery network 110 includes one or more individual battery units 112a-d. In one embodiment, the battery units 112a-d utilize lead acid chemistry, however, other battery chemistries can equally be used.

The battery units 112a-d can be of any size or capacity used for residential or commercial use. The battery units 112a-d are preferably rechargeable secondary batteries, but primary batteries are not excluded. The battery units 112a-d can be of any battery chemistry. A connection topology of the battery network 110 refers to a circuit configuration defining a flow of current between the main positive and negative terminals of the battery network 110. For example, the battery network 110 can be connected in series, in parallel, or any combination of the two.

In one application, the battery network 110 can be in active use to power a mobile system, such as an electric-powered automobile. In another application, the battery network 110 can be in reserve use as backup power for a telecommunications system. Preferably VLA or VRLA-type batteries are implemented. Typically, VLRA-type batteries have higher failure rates and failures can be more catastrophic, making the identification of battery conditions even more critical.

The testing device 120 can be, for example, a handheld device configured with hardware and firmware specific to battery testing, such as the EC-series ANALYZER produced by Global Energy Innovations of San Jose, Calif. Additionally, the testing device 120 can generate and input an excitation or perturbation signal (or signals) of a known frequency (or frequencies), and known current amplitude and phase over line 103. In this case, line 103 can include, for example, a 4-conductor electrical cable. The perturbation signal is applied to each of the battery units 112a-d in turn. The amplitude and phase shift of the voltage responses of the batteries to the excitation signals at the various frequencies are measured, and used to derive impedance values for the battery. In other embodiments, the excitation signal can be a square wave or a triangle wave, or a voltage or a current step, and the testing device 120 derives impedance values for the battery from the battery's response to those excitation signals. In one implementation, the testing device 120 is also able to measure voltage, specific gravity, and other characteristics of the battery network 110.

The computing device 130 can be a personal computer, a server blade, a laptop computer, a single-board computer, or any other type of processor-controlled device. In one implementation, the testing device 120 is used on site 109 for immediate, basic testing results while the computing device 130, having more processing power, a larger display and a more complete keyboard, can be used off site for further analysis. Data can be uploaded in batch mode after collection from the sites, or in real time through a wireless network connection.

The powered device 125 can be any device drawing power for operation from the battery network 110. For example, the powered device 125 can be an electrical automobile, a personal computer or a network server, a section of a railroad system, a bank security system, a commercial property, or the like.

Figure 2:
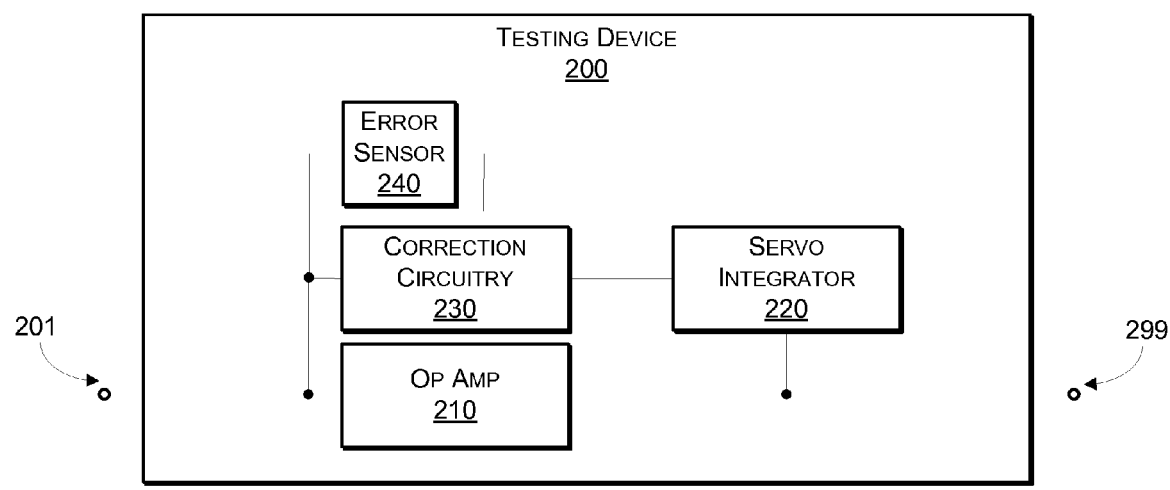
FIG. 2 is a block diagram illustrating a testing device, according to one embodiment of the present invention.

FIG. 2 is a block diagram showing exemplary components internal to a testing device 200 (such as testing device 120). The testing device 200 comprises an op amp 210 (e.g., a differential op amp), a servo integrator 220 (e.g., a digital servo integrator with a capacitor), a correction circuitry 330 (e.g., a voltage-controlled current source), and an error sensor 340 (e.g., an op amp). An exemplary circuit implementation of the testing device 200 is described below with respect to FIG. 3.

During an impedance measurement, a DUT (device under test), such as a battery unit, is stimulated with an AC current provided by an external circuit and the testing device 200 is called upon to detect and measure the resulting AC voltage developed across the internal impedance of the DUT.

At a high-level, the op amp 210 amplifies an excitation response signal received at an input terminal 201 for output at an output terminal 299. In one embodiment, the servo integrator 220 determines a DC bias in the amplified response signal, and in response, produces a servo feedback signal to compensate for the DC bias. The correction circuitry 230 can receive the servo feedback signal and outputs a correction current to the op amp 220 to remove the DC bias. The error sensor 240 is coupled to receive the correction current and output a feedback control signal to the correction circuitry to adjust for internal errors. The internal errors, in one implementation, include a variable DC bias. As a result, a corrected AC signal is output at the output terminal 299.

Furthermore, other components can be included in the testing device 200 to support specific-testing functionality. Exemplary components not shown in FIG. 1 can include a data input/output port for connecting to external data sources, a signal input/output port for connecting to a device under test, a analyzing engine to determine battery conditions from impedance and other factors, an operating system and a user interface module.

Figure 3:
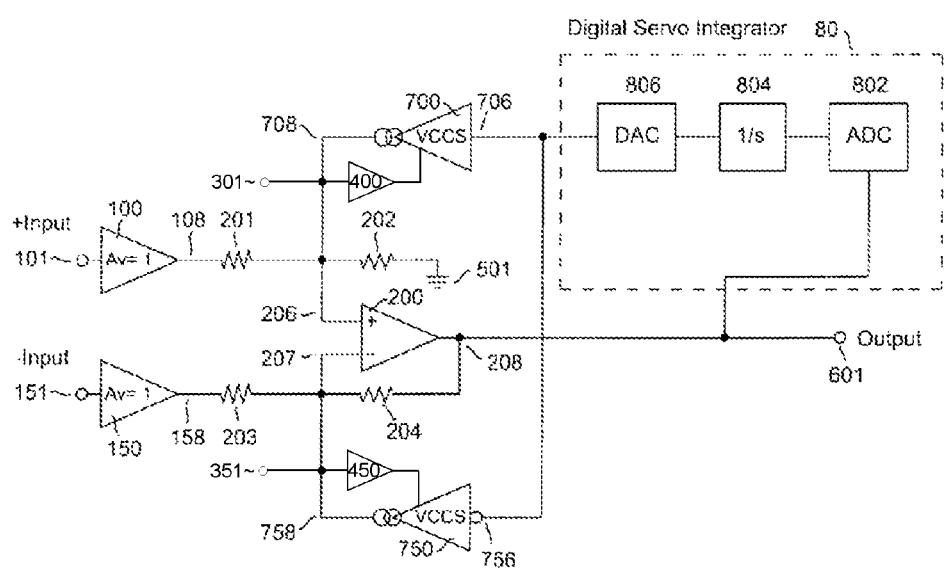
FIG. 3 is a schematic diagram illustrating circuitry to compensate for DC offsets and internal errors arising from the test equipment, according to one embodiment of the present invention.

FIG. 3 is a schematic diagram illustrating circuitry 300, within the testing device 200 of FIG. 2, to compensate for DC offsets and internal errors arising from the test equipment, according to one embodiment of the present invention. The circuitry 300 comprises a pair of input buffers 100, 150, a primary differential amplifier 200 and servo feedback circuitry 80. Complementary servo feedback currents are conveyed to the inputs of the primary differential amplifier to achieve DC and low-frequency compensation in the main output signal at output node 601.

Input node 101 receives a first input signal from the first terminal of the DUT and unity-gain amplifier 100 provides a buffered copy at output node 108, while input node 151 receives a second input signal from the second terminal of a DUT and unity-gain amplifier 150 provides a buffered copy at output node 158. The high input impedances of amplifiers 100 and 150 ensure that the DUT is effectively isolated from the circuitry 300.

Differential amplifier 200, disposed in the forward gain path of an amplifier apparatus, constitutes a primary amplifier that receives a first input signal through impedance element 201 at its non-inverting input 206, and receives a second input signal through impedance element 203 at its inverting input 207, to produce main output signal 601. In practice, the potential on a first terminal of an external DUT represents the first input signal, while the potential on its second terminal represents the second input signal.

A copy of output signal 601 is conveyed to ADC 802, where it is converted into a digital representation. An integrator algorithm, implemented in suitable digital hardware that may be a microprocessor or a Digital Signal Processor (DSP) 804, performs numerical integration to yield a digital value implicitly referenced to the ground potential. This digital value is conveyed to DAC 806 where it is converted into an analog control signal 706 for controlled current source 700 that provides a directly proportional output current 708, which current may be either a positive (source) current or a negative (sink) current according to the polarity of its controlling input signal. The symbol used for current source 700 denotes a voltage-controlled current source having bipolar (e.g., source/sink) output capability, a non-inverting transfer function and an output impedance typically exceeding at least several megohms. Additionally, signal 706 is coupled as the controlling input 756 to inverting voltage-controlled current source 750, which provides a proportional bipolar output current 758. In similar fashion, the symbol used for current source 750 denotes a voltage-controlled current source having bipolar output capability, an inverting transfer function and an output impedance typically exceeding at least several megohms. Because the two current sources receive the same input signal, they provide output currents substantially identical in magnitude but of complementary (that is, opposite) polarity.

Signal 708, representing a first current-mode negative servo feedback signal, is conveyed from current source 700 to non-inverting input 206 of primary amplifier 200, and signal 758, representing a second current-mode negative servo feedback signal is conveyed from current source 750 to inverting input 207. The low-pass characteristic of the feedback signal means that DC signals present in the differential input signal experience the greatest attenuation, while the attenuation of AC signals varies inversely with frequency.

When a DUT exhibiting a DC bias across its terminals is connected between inputs 101 and 151, the servo integrator establishes an equilibrium condition such that average DC potential of the residual signal appearing at main output 601 is substantially equal to reference potential 501, conventionally ground. Hence, the differential DC voltage present between nodes 206 and 207 is also substantially equal to zero. Since the input impedances, with respect to node 501 (ground), exhibited at input 101 and input 151 are preferably the same, the potential of a biased DUT connected to these inputs appears "centered" about local ground, such that the voltages at nodes 101 and 151 are equal in magnitude but opposite in polarity.

The complementary nature of the servo feedback currents means that the sum of the voltages developed across resistors 201 and 203 are equal in magnitude but opposite in polarity to the average DC potential present across the DUT. In other words, the total voltage developed across these resistors by the servo feedback current precisely offsets the average DC potential of the DUT. Because the differential voltage present between nodes 108 and 158 is substantially identical to the voltage across the DUT, the servo currents that flow through resistors 201 and 203 are absorbed by the low-impedance outputs of unity gain amplifiers 100 and 150.

Amplifier circuits develop voltage and current offset errors. In FIG. 3, the net effect of substantially all offset errors present at any given time is represented by fictitious input signals 301 and 351. Some of the errors vary unpredictably with changes in temperature, humidity or other environmental conditions such as RF interference while others are intrinsic to the active components. Automatic compensation for the variable offsets, in one embodiment, is accomplished by error sensors 400 and 450.

Figure 4:
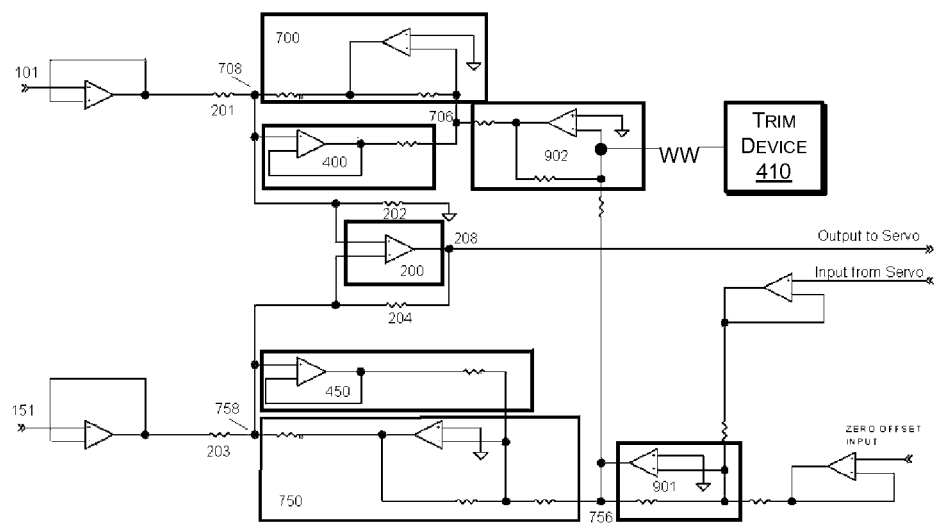
FIG. 4 is a schematic diagram illustrating more-detailed circuitry with the addition of a trim device, according to one embodiment of the present invention.

In the exemplary embodiment of FIG. 4, components 400, 450, 700 and 750 (shown schematically as operational amplifiers) constitute the feedback paths that provide automatic compensation for variable offset errors originating within the amplifier apparatus. The algebraic sums of these errors are buffered by amplifiers 400 and 450 to minimize interference with the high impedance of inputs for the differential amplifier. The error signals are then inverted and combined at nodes 706 and 756 with the voltage control signal from the servo integrator. The effect is to continuously modify the feedback current flowing in resistors 201 and 203 to compensate for the effect of variable offset errors.

In a similar manner, the stable (but typically larger) DC errors intrinsic to the active components of the test instrument (which may include circuitry both upstream and downstream of the amplifier apparatus such as switching relays) are corrected by means of a ZERO OFFSET input generated by the main processor of the test instrument. The correction signal is adjusted by component 901 and inverted by component 902 and then combined at nodes 706 and 756 with the voltage control signal from the servo integrator. The effect is to adjust the feedback current flowing in resistors 201 and 203 to compensate for the effect of offset errors intrinsic to the active components. This balanced approach represents a major advance over the prior art, where zero offset corrections were applied to only one side of the differential amplifier circuit and led to a drifting DC offset in the uncorrected side of the circuitry.

In an additional embodiment, control loops can be added to correct for external sources of error such as random or intermittent electrical interference. For example, batteries that form part of renewable energy systems such as solar arrays or wind farms are subject to discontinuous charging and discharging events. When such events occur during a battery test, they can inject both AC and DC interference that degrades the signal to noise ratio. Amplification of a DC offset voltage (resulting e.g., from a step change in charging or load current) can bias the amplifier output sufficiently to cause "clipping" of AC waveforms. Clipping of the AC response signal from the DUT has a direct impact on the accuracy of the impedance measurement. Less obvious are the deleterious effects that can arise from the clipping of AC noise signals. First, the presence of a DC bias can cause asymmetric clipping of the AC noise; subsequent integration of the asymmetric output then worsens the clipping of the DUT response signal by giving rise to additional DC offsets. Second, under certain conditions, even symmetric clipping of the AC noise is found to degrade signal-to-noise ratios.

To limit the problem of clipping, the amplitude of the mixed AC waveform is adjusted downwards by sampling the output waveform (node 601), attenuating the waveform and shifting its phase by 180 degrees, and feeding back the out-of-phase waveform to the inputs of the differential amplifier (nodes 206 and 207).

The balanced approach to self-correction disclosed herein provides an amplifier with exceptional sensitivity to the differential voltage applied to the inputs while maintaining the input impedance at extremely high values that prevents any interference with the DUT.

FIG. 4 is a schematic diagram illustrating more-detailed circuitry 400 with the addition of a trim device 410, according to one embodiment of the present invention.

The trim device 410 can comprise a variable resistor. Because elements in the tertiary feedback path (including blocks 901, 902, 400, 450, 700 and 750) can exhibit offsetting voltage and current terms, the inventing block 902 is trimmed to obtain a correct zero output at 208 in the rest sate of the circuitry 400. As a result, balance is maintained.

Figure 5:
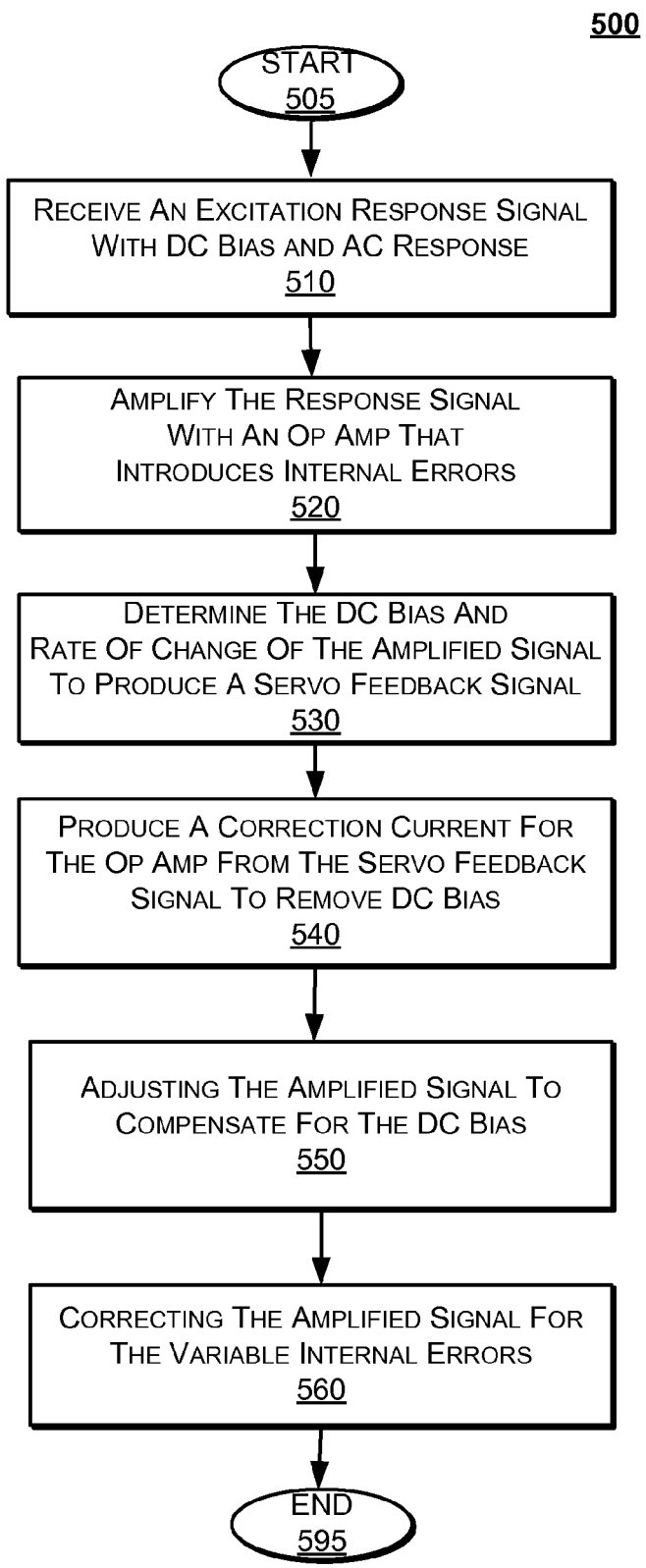
FIG. 5 is a flow diagram illustrating a method for compensating for DC offsets and internal errors arising from the test equipment, according to one embodiment of the present invention.

FIG. 5 is a flow diagram illustrating a method 500 for compensating for DC offsets and internal errors arising from the test equipment, according to one embodiment of the present invention. The method 500 can be implemented with the components shown in FIGS. 1-4 and described herein.

At step 510, an excitation response signal comprising a DC bias and an AC response is received. At step 520, the response signal is amplified with an op amp that introduces variable internal errors to the response signal. At step 530, the DC bias and a rate of change of the amplified response signal is determined. In response, a servo feedback signal is produced to compensate for the DC bias. At step 540, a correction current is produced for the op amp from the servo feedback signal in order to remove the DC bias. At step 550, the correction current is adjusted for internal errors sensed in the correction circuit with a feedback control signal. At step 560, a corrected response signal is output.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The invention claimed is:

1. A battery testing device to automatically compensate for DC offsets arising from the battery testing device, comprising:
   an input terminal to receive an excitation response signal comprising a DC bias and an AC response;
   an op amp coupled to receive and to amplify the response signal, the op amp introducing internal errors manifested in the amplified response signal;
   a servo integrator coupled to receive the amplified response signal and to determine the DC bias and a rate of change of the amplified response signal, and in response, to produce a servo feedback signal to compensate for the DC bias;
   a correction circuitry, coupled to receive the servo feedback signal and to output a correction current to the op amp, and to produce the correction current in order to remove the DC bias;
   an error sensing device, coupled to receive the correction current and to output a feedback control signal, to adjust for the internal errors introduced by the correction circuitry; and
   an output terminal to output a corrected AC signal.

2. The device of claim 1, further comprising:
   a signal output to generate an excitation signal comprising an AC signal.

3. The device of claim 1, wherein the servo integrator comprises an analog-to-digital converter to sample the amplified response signal, a virtual integrator receiving the samples and providing a digital integral signal representing a time-integral of the amplified response signal, and a digital-to-analog converter to receive the digital integral signal and provide the servo feedback signal.

4. The device of claim 1, wherein an amount of the DC bias is substantially fixed and an amount of the internal errors is a variable DC bias.

5. The device of claim 1, wherein the op amp comprises a differential op amp having a non-inverting terminal to receive a first portion of the excitation response signal and an inverting terminal to receive a second portion of the excitation response signal.

6. The device of claim 5, wherein the correction circuitry comprises a positive input correction device coupled to a first error sensing device and the non-inverting terminal of the differential op amp, and a negative input correction device coupled to a second error sensing device and the inverting terminal of the differential op amp, the negative input correction device receiving an inverted servo feedback signal.

7. The device of claim 6, wherein the positive input correction device comprises a first voltage controlled current source and the negative input correction device comprises a second voltage controlled current source.

8. The device of claim 7, wherein the first voltage controlled current source provides a bipolar output current that is inversely proportional to the servo feedback signal, and the second voltage controlled current source provides a bipolar output current that is directly proportional to the servo feedback current.

9. The device of claim 7, wherein the first voltage controlled current source provides a bipolar output current that is directly proportional to the servo feedback signal, and the second voltage controlled current source provides a bipolar output current that is inversely proportional to the servo feedback current.

10. The device of claim 1, wherein the correction circuitry comprises a trim device coupled to the servo integrator to provide variable resistance to the servo feedback signal.

11. The device of claim 1, wherein the servo integrator is coupled to the output terminal and to the correction circuitry.

12. The device of claim 1 wherein the input terminal is coupled to a battery unit, and the output terminal is coupled to an analysis engine to determine one or more conditions associated with the battery unit based on the corrected AC signal.

13. The device of claim 1, wherein the AC response is a small signal of less than 0.1 mV AC.

14. A method in a battery testing device to automatically compensate for DC offsets arising from the battery testing device, comprising:
   receiving an excitation response signal comprising a DC bias and an AC response;
   amplifying the response signal with an op amp, the op amp introducing internal errors manifested in the amplified response signal;
   determining the DC bias and a rate of change of the amplified response signal to, in response, produce a servo feedback signal that compensates for the DC bias;
   producing a correction current for the op amp from the servo feedback signal in order to remove the DC bias;
   adjusting the correction current for internal errors sensed in the correction circuit with a feedback control signal; and
   outputting a corrected response signal.

* * * * *